US012205823B2

(12) United States Patent
Takasaki et al.

(10) Patent No.: US 12,205,823 B2
(45) Date of Patent: Jan. 21, 2025

(54) METHOD FOR PRODUCING ELEMENT CHIPS

(71) Applicant: Panasonic Intellectual Property Management Co., Ltd., Osaka (JP)

(72) Inventors: Toshiyuki Takasaki, Osaka (JP); Ryota Furukawa, Osaka (JP); Atsushi Harikai, Kyoto (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 515 days.

(21) Appl. No.: 17/550,309

(22) Filed: Dec. 14, 2021

(65) Prior Publication Data

US 2022/0199411 A1 Jun. 23, 2022

(30) Foreign Application Priority Data

Dec. 17, 2020 (JP) .................................. 2020-208978

(51) Int. Cl.
*H01L 21/3065* (2006.01)
*H01L 21/311* (2006.01)
*H01L 21/78* (2006.01)

(52) U.S. Cl.
CPC .... *H01L 21/3065* (2013.01); *H01L 21/31116* (2013.01); *H01L 21/78* (2013.01)

(58) Field of Classification Search
CPC . H01L 21/3065; H01L 21/31116; H01L 21/78
See application file for complete search history.

(56) References Cited

U.S. PATENT DOCUMENTS 8,703,581 B2    4/2014   Lei et al.
9,263,308 B2    2/2016   Lei et al.
(Continued)

FOREIGN PATENT DOCUMENTS

JP   2006-049817 A   2/2006
JP   2014-523112 A   9/2014
(Continued)

OTHER PUBLICATIONS

Corresponding Japanese Patent Application No. 2020-208978, First Office Action, date mailed Aug. 6, 2024.

*Primary Examiner* — Nathan W Ha
(74) *Attorney, Agent, or Firm* — PEARNE & GORDON LLP (57) ABSTRACT

Disclosed is a method for producing element chips. The method includes: a preparing step of preparing a substrate 10 that is held on a holding sheet 22 that is supported by a frame 21, the substrate including element regions and dicing regions; a protective film forming step of forming a protective film 15 so as to cover the frame 21, the holding sheet 22, and the substrate 10; a patterning step of removing a part of the protective film 15 so as to expose the dicing regions of the substrate 10; a plasma dicing step including a process that uses a plasma that contains fluorine, the plasma dicing step being a step of individualizing the substrate 10 into a plurality of element chips; and a fluorine removing step of removing, together with the protective film 15, fluorine attached to the protective film 15 in the plasma dicing step.

7 Claims, 6 Drawing Sheets

(56) References Cited

U.S. PATENT DOCUMENTS

| | | | |
|---|---|---|---|
| 10,026,605 B2* | 7/2018 | Doub | H01L 21/78 |
| 11,545,394 B2* | 1/2023 | Day | H01L 21/67069 |
| 2008/0085604 A1 | 4/2008 | Hoshino et al. | |
| 2010/0197115 A1* | 8/2010 | Arita | H01L 21/6836 |
| | | | 257/E21.599 |
| 2012/0322233 A1* | 12/2012 | Lei | B23K 26/364 |
| | | | 257/E21.602 |
| 2015/0064878 A1 | 3/2015 | Lei et al. | |
| 2015/0064922 A1* | 3/2015 | Kitamura | H01J 37/32238 |
| | | | 438/723 |
| 2016/0049313 A1 | 2/2016 | Kumar et al. | |
| 2016/0293456 A1* | 10/2016 | Okita | H01L 21/6836 |
| 2017/0229365 A1* | 8/2017 | Harikai | H01L 21/78 |
| 2017/0345781 A1* | 11/2017 | Harikai | H01L 23/49811 |
| 2018/0240678 A1* | 8/2018 | Itou | H01L 21/7806 |
| 2018/0240697 A1* | 8/2018 | Okita | H01J 37/32816 |
| 2018/0308819 A1 | 10/2018 | Uzoh | |
| 2019/0066981 A1* | 2/2019 | Okita | H01L 21/6836 |
| 2019/0122892 A1* | 4/2019 | Okita | H01L 21/30655 |
| 2019/0189513 A1* | 6/2019 | Chiang | H01L 21/6836 |
| 2019/0221479 A1* | 7/2019 | Okita | H01L 21/78 |
| 2019/0295894 A1* | 9/2019 | Okita | H01L 21/268 |
| 2019/0304838 A1* | 10/2019 | Saeki | H01L 21/30655 |
| 2019/0371668 A1* | 12/2019 | Karasaki | H01L 23/544 |
| 2020/0098636 A1* | 3/2020 | Harikai | H01L 21/6835 |
| 2020/0135480 A1* | 4/2020 | Tabata | H01L 21/67109 |
| 2020/0381304 A1 | 12/2020 | Saeki et al. | |
| 2021/0183703 A1* | 6/2021 | Day | H01L 21/68721 |

FOREIGN PATENT DOCUMENTS

| | | |
|---|---|---|
| JP | 2016-531447 A | 10/2016 |
| JP | 2020-518133 A | 6/2020 |
| JP | 2020-194948 A | 12/2020 |

\* cited by examiner

METHOD FOR PRODUCING ELEMENT CHIPS

CROSS REFERENCE TO RELATED APPLICATION

The present application is based on and claims priority under 35 U.S.C. § 119 with respect to the Japanese Patent Application No. 2020-208978 filed on Dec. 17, 2020, of which entire content is incorporated herein by reference into the present application.

TECHNICAL FIELD

The present disclosure relates to a method for producing element chips.

BACKGROUND ART

A plurality of element chips can be produced simultaneously by dicing a semiconductor substrate that includes a plurality of element regions. Bosch process is known as a method for dicing a silicon substrate by deep plasma etching. In the Bosch process, plasma etching and protective film forming are repeated, and the silicon layer is thereby deeply etched. In the plasma etching, a gas that contains fluorine may be used as the etching gas.

Japanese Laid-Open Patent Publication No. 2006-49817 discloses a plasma processing method including supplying a processing gas that contains fluorine gas to a plasma generation chamber, generating a plasma by repeatedly applying a high-frequency electric field and stopping the application of the high-frequency electric field, and performing substrate processing by irradiating a substrate with the plasma.

Japanese Laid-Open Patent Publication No. 2014-523112, the corresponding international publication is WO 2012/173768, discloses a method for dicing a substrate comprising a plurality of ICs, the method comprising: forming a mask over the substrate covering and protecting the ICs, the mask comprising a layer of water soluble material in contact with a top surface of the IC; patterning the mask with a laser scribing process to provide a patterned mask with gaps, exposing regions of the substrate between the ICs; and plasma etching the substrate through the gaps in the patterned mask to individualize the ICs.

Currently, there is a demand for a method for producing element chips reliably and at low cost. Under the circumstances, it is an object of the present disclosure to provide a method with which it is possible to produce element chips reliably and at low cost by suppressing negative effects caused by residual fluorine.

SUMMARY

An aspect of the present disclosure relates to a method for producing element chips. The method for producing element chips includes: a preparing step of preparing a substrate held on a holding sheet supported by a frame, the substrate including element regions and dicing regions; a protective film forming step of forming a protective film to cover the frame, the holding sheet, and the substrate; a patterning step of removing a part of a substrate covering portion of the protective film to expose the dicing regions of the substrate, the substrate covering portion covering the substrate; a plasma dicing step including a process that uses a plasma that contains fluorine, the plasma dicing step being a step of individualizing the substrate into a plurality of element chips; and a fluorine removing step of removing, together with the protective film, fluorine attached to the protective film in the plasma dicing step.

According to the present disclosure, it is possible to suppress negative effects caused by residual fluorine during production of element chips by plasma dicing the substrate. For this reason, according to the present disclosure, element chips can be produced reliably and at low cost.

DETAILED DESCRIPTION

Hereinafter, an embodiment according to the present disclosure will be described by way of examples. However, the present disclosure is not limited to the examples described below. In the description given below, specific numerical values and materials are given as examples, but other numerical values and materials may be used as long as the advantageous effects of the present disclosure can be obtained. In the specification of the present application, the expression "a range of numerical values A to B" means that the range includes the numerical values A and B.

When a substrate is diced by performing plasma etching using an etching gas that contains fluorine gas, fluorine remains in the diced substrate (element chips) and a carrier supporting the substrate. The residual fluorine may react with moisture in the air to form fluoric acid. The inventors of the invention of the present application found, as a result of studies, that a major problem is that the formed fluoric acid reduces the reliability of the element chips and negatively affects apparatuses. For example, the formed fluoric acid may corrode the electrode pads or bumps of the element chips to reduce the reliability of the element chips. Also, the formed fluoric acid may serve as an impurity and negatively affect an apparatus used in a subsequent step, resulting in a reduction in the productivity and an increase in the production cost. The present disclosure has been made based on the new findings.

(Method for Producing Element Chips)

A method for producing element chips according to the present embodiment includes a preparing step, a protective film forming step, a patterning step, a plasma dicing step, and a fluorine removing step that are performed in this order. Hereinafter, these steps will be described.

(Preparing Step)

The preparing step is a step of preparing a substrate held on a holding sheet supported by a frame, the substrate including element regions and dicing regions. Hereinafter, the frame and the holding sheet may be collectively referred to as "transport carrier". The frame and the holding sheet are not particularly limited, and any known frame and holding sheet can be used.

The substrate includes a semiconductor layer. A semiconductor layer that constitutes the semiconductor layer is, for example, a silicon layer, but may be any other semiconductor layer (for example, a III-V group compound semiconductor layer). A typical example of the substrate includes a semiconductor substrate and an element layer formed on the surface of the semiconductor substrate. The element layer is divided into a plurality of element regions by dicing regions. The dicing regions are arranged in the form of, for example, a lattice. The dicing regions are regions that are removed in the plasma dicing step.

The element regions each include a portion that functions as an element. Examples of elements include a semiconductor element, an electronic component, a microelectromechanical system (MEMS), and the like. The element layer may include a semiconductor layer, an insulating layer, a metal layer, a resin layer (for example, a polyimide layer), a resist layer, electrode pads, bumps, and the like according to the type of element. The element regions are formed in advance. The element regions can be formed by using a known method.

The planar shape of the substrate is not particularly limited. The planar shape of the substrate may be substantially circular or substantially rectangular.

The frame includes an opening with a size that is greater than or equal to the size of the substrate. Examples of materials of the frame include metals (aluminum, stainless steel, and the like), resins, and the like. The holding sheet is fixed to the frame. The holding sheet is usually disposed to close the opening of the frame. The substrate is held by the holding sheet.

As the holding sheet, a sheet that can hold the substrate during processing is used. As the holding sheet, a known holding sheet used in plasma processing can be used. As the holding sheet, a stretchable sheet may be used. The holding sheet may include a non-adhesive layer (non-adhesive sheet) and an adhesive layer formed on the non-adhesive layer.

The material of the non-adhesive layer is not particularly limited. For example, thermoplastic resins such as polyolefins including polyethylene and polypropylene, polyesters including polyethylene terephthalate, and the like can be used. The non-adhesive layer may contain various additives. For example, the non-adhesive layer may contain a rubber component for imparting stretchability (for example, ethylene-propylene rubber (EPM), ethylene-propylene-diene rubber (EPDM), or the like), a plasticizing agent, a softening agent, an antioxidant, a conductive material, and the like.

The holding sheet may include a die attach film. In this case, the substrate may be fixed to the holding sheet (for example, the adhesive layer of the holding sheet) by the die attach film. As the die attach film, a known die attach film can be used.

There is an exposed region on a major surface of the holding sheet on which the substrate is held. Specifically, in the major surface, a region between the substrate and the frame is exposed. Hereinafter, the exposed region may also be referred to as "exposed region (E)".

(Protective Film Forming Step)

The protective film forming step is a step of forming a protective film to cover the frame, the holding sheet, and the substrate. The protective film is formed on a side on which the substrate is disposed. As a typical example, the protective film is formed to cover the entire exposed surface of the substrate, the entire exposed region (E) of the holding sheet, and a portion of the frame surface that is adjacent to at least the exposed region (E). In this case, 50% or more (for example, 70% or more or 80% or more) of the surface area of the frame surface on the side where the substrate is present may be covered by the protective film, or the entire frame surface may be covered by the protective film.

In the case where the exposed region (E) and the frame are not covered by the protective film, it is not easy to remove fluorine attached to the exposed region (E) and the frame. On the other hand, in the case where the exposed region (E) and the frame are covered by the protective film, the fluorine can be easily removed by simply removing the protective film. In particular, when a water-soluble protective film is used, the protective film and the fluorine can be removed by simply washing with a liquid that contains water.

The protective film may be a film that is water soluble and can be grooved by laser grooving. In this case, a portion of the protective film can be removed by performing laser grooving in the patterning step. Furthermore, in this case, a liquid that contains water can be used as a liquid that dissolves the protective film in the fluorine removing step, which will be described later. The film that can be grooved by laser grooving is a film a portion of which is irradiated with laser, and is thereby grooved and removed.

The film that is water soluble and can be grooved by laser grooving is not particularly limited. A film that is water soluble and can be grooved by laser grooving and a coating liquid for forming the film are known, and thus the film may be formed by using a known coating liquid. The coating liquid for forming the film that is water soluble and can be grooved by laser grooving may be, for example, a liquid that contains any of the following: polyvinyl acetate, saponification products thereof (a partial saponification product of polyvinyl acetate, polyvinyl alcohol, and the like), polyacrylic acid, polymethacrylic acid, polyacrylamide, 2-acrylamide-2-methylpropanesulfonic acid, polyvinyl pyrrolidone, polystyrene sulfonate, polyethylene oxide, water soluble polyester, oxazole-based water soluble polymers (oxazole-2-ethyl-4,5-dihydrohomopolymer, and the like), and salts thereof (alkali metal salts, ammonium salts, and the like).

Also, from the viewpoint of preventing fluorine that has been attached to or implanted into the protective film during plasma processing from permeating through the protective film and attaching to the element surface, the protective film preferably has a low Ohnishi parameter. As used herein, Ohnishi parameter refers to a value defined by $N/(N_C-N_O)$, where N represents the total number of atoms in a compound that constitutes the protective film, $N_C$ represents the number of carbon atoms in the compound that constitutes the protective film, and $N_O$ represents the number of oxygen atoms in the compound that constitutes the protective film. However, it is often the case that a water soluble protective film has a relatively large Ohnishi parameter and has the property of allowing fluorine to easily permeate therethrough. For this reason, in the case where a water soluble protective film that has a relatively large Ohnishi parameter (for example, 8.5 or more) is used, the protective film preferably has a thickness of 3 or more, and more preferably 5 μm or more. Alternatively, it is desirable to use a water soluble protective film that has a relatively small Ohnishi parameter. In this case, the water soluble protective film preferably has an Ohnishi parameter of 8.5 or less, and more preferably 5.5 or less.

The protective film may be a photoresist film. The photoresist film is not particularly limited, and may be formed by using a known photoresist. Alternatively, the protective film may be composed of a first film made of a photoresist and a second film that is water soluble. The first film is formed to cover at least the substrate. The first film may be formed to cover the substrate and a portion of the holding sheet that is adjacent to the substrate. The second film is formed to cover at least a portion of the frame that is adjacent to the exposed region (E) of the holding sheet. The second film may be formed to cover the frame and the exposed region (E).

The method for forming the protective film is not particularly limited. For example, the protective film may be formed by applying a coating liquid for forming the protective film, and then drying the coating liquid. The method for applying the coating liquid is not limited, and a spray coating method or a spin coating method can be used. It is preferable to use a spray coating method because, even when the application surface has irregularities, the variation in the thickness of the coating film can be suppressed.

The protective film formed on the substrate functions as a mask in the plasma dicing step, which will be described later. For this reason, the protective film on the substrate is made of a material that functions as a mask and has a thickness required to achieve the function as a mask. The thickness required to achieve the function as a mask depends on the material of the protective film, the conditions for the plasma dicing step, and the like.

In order for the protective film to function as a mask, the protective film is required to have a thickness TM that does not disappear during plasma dicing. The thickness TM of the protective film that is required for the mask (protective film) to not disappear during plasma dicing is calculated by using the following equation: $TM=(T0/S) \times \alpha$, where $T0$ represents the thickness of an etching target film, $S$ represents the selectivity ratio of the protective film when the etching target film is etched, and $\alpha$ represents a correction coefficient. Here, the selectivity ratio $S$ is defined as $E0/EM$ that is the ratio of etching speed $E0$ of the etching target film to etching speed $EM$ of the protective film. For example, in the case where the etching target film is made of Si, the selectivity ratio is 100 to 200. In the case where the etching target film is made of GaAs, the selectivity ratio is about 10. In the case where the etching target film is a silicon oxide film or a silicon nitride film, the selectivity ratio is about 2 to 3. Also, the correction coefficient $\alpha$ is set by taking into consideration the in-plane uniformity of the thickness of the protective film (about 10%) and the amount of over etching of plasma dicing (about 10%), and the correction coefficient $\alpha$ may be, for example, about 1.1 to 1.3.

On the other hand, as described above, in the case where a water soluble protective film is used, in order to prevent fluorine that has been attached to or implanted into the protective film during plasma processing from permeating through the protective film and attaching to the element surface, the thickness of the protective film is preferably 3 μm or more, and more preferably 5 μm or more. Accordingly, the thickness of the protective film is preferably a thickness obtained by adding, to the thickness TM described above, 3 μm (preferably, 5 μm) that is the thickness for suppressing the permeation of fluorine.

The thickness of the protective film on the substrate may be in a range of, for example, 4 μm to 50 μm. As a typical example, the thickness of the protective film on the substrate is substantially the same as the thickness of the protective film formed on the transport carrier. The time required to form the protective film can be shortened by forming the protective film on the transport carrier to be thinner than the protective film on the substrate.

(Patterning Step)

In the patterning step, the protective film is patterned. Specifically, the patterning step is a step of removing a part of a substrate covering portion of the protective film to expose the dicing regions of the substrate. In the case where the protective film is a film that is water soluble and can be grooved by laser grooving, predetermined part of the protective film are irradiated with laser, and the part can be thereby removed (laser grooving). The conditions for laser irradiation are not particularly limited, and known conditions for laser grooving may be applied according to the material and the thickness of the protective film.

In the case where the protective film is a photoresist film, the protective film can be patterned by performing a known photolithography etching step.

(Plasma Dicing Step)

The plasma dicing step includes a process that uses a plasma that contains fluorine, and is a step of individualizing the substrate into element chips. Specifically, the substrate can be divided into a plurality of element chips by etching the substrate to penetrate through the substrate at portions that correspond to the dicing regions.

The process that uses a plasma that contains fluorine includes, for example, an etching step that uses a first plasma that contains fluorine. Alternatively, the process that uses a plasma that contains fluorine may include, for example, a process other than the etching step. For example, the process that uses a plasma that contains fluorine includes a protective layer forming step that uses a plasma that contains fluorine.

In the etching step, the portions of the substrate that correspond to the dicing regions and were exposed in the patterning step are etched. The first plasma that contains fluorine is generated by using an etching gas (process gas) that contains fluorine. The etching gas that contains fluorine includes a fluorine-containing gas. Examples of fluorine-containing gases include $CF_4$, $C_4F_8$, $CHF_3$, $CH_2F_2$, $NF_3$, $XeF_2$, $XeF_6$, $SF_6$, and the like. These gases can be used alone or in a combination of two or more, or may be mixed with a diluent gas or an oxygen-containing gas. As the diluent gas, for example, an inert gas such as Ar or He can be used. As the oxygen-containing gas, for example, $O_2$, CO, $CO_2$, or the like can be used.

In the case where the etching target is a silicon substrate (silicon layer), the process that includes the etching process may be a process called "Bosch process". For example, the plasma dicing step may include a process in which the group of steps including a silicon layer etching step, a protective layer forming step, and a protective layer etching step in this order is repeated. In the silicon layer etching step, portions of the silicon layer are plasma etched to form recesses in the silicon layer. In the protective layer forming step, a protective layer is formed within each of the formed recesses. In the protective layer etching step, the protective layer on the bottom of each of the recesses is plasma etched and removed. By repeating these steps, the silicon layer is deeply etched. These steps may be performed under known conditions used in the Bosch process.

(Fluorine Removing Step)

In the fluorine removing step, the fluorine attached to the protective film in the plasma dicing step is removed together with the protective film. The method for removing the protective film is selected according to the type of protective film.

In the fluorine removing step, the protective film may be removed by bringing the protective film into contact with a liquid that dissolves the protective film. Hereinafter, the liquid that dissolves the protective film may be referred to as "liquid (L)". The liquid (L) is a liquid that dissolves the protective film, but does not substantially dissolve the holding sheet. In the case where the protective film is a photoresist film, the protective film may be brought into contact with a liquid (L) that dissolves the photoresist film (for example, an organic solvent or an alkaline stripping solution). In the case where the protective film is a water-soluble film, the protective film can be removed by bringing the protective film into contact with a liquid (L) that contains water. The liquid (L) that contains water may be a mixture of water and other liquids, or may be water (for example, deionized water or the like). With the use of a water-soluble protective film, the protective film can be removed by using a liquid (L) that has a small environmental impact and is inexpensive.

The method for bringing the protective film into contact with the liquid (L) is not particularly limited. For example, the substrate and the transport carrier may be immersed in the liquid (L). Alternatively, the liquid (L) may be brought into contact with the protective film by applying a flow of the liquid (L) to the protective film. For example, the liquid (L) ejected from a nozzle may be brought into contact with the protective film. In this case, a high-pressure liquid (L) may be brought into contact with the protective film by using a high-pressure cleaning nozzle that discharges the liquid (L) at a high pressure. Alternatively, a mixture of the liquid (L) and a gas (for example, an inert gas such as nitrogen gas) may be brought into contact with the protective film by using a two-fluid nozzle.

The protective film may be removed partially or entirely by performing plasma ashing or the like. Also, a portion of the protective film may be removed by performing plasma ashing, and thereafter, the remaining protective film may be removed by bringing the protective film into contact with a liquid that dissolves the protective film. The plasma ashing can be performed by using a known method such as, for example, a method of generating a plasma by using a process gas that contains oxygen gas. The plasma ashing may be performed by using the same plasma processing apparatus as that used in the plasma dicing step. However, in this case, fluorine attached to the reaction chamber of the plasma processing apparatus during the plasma dicing step may again attach to the substrate during the plasma ashing. For this reason, when removing the protective film by performing plasma ashing, it is preferable to remove only a portion of the surface of the protective film (light ashing). With the light ashing, even if the surface of the protective film alters in quality in the plasma dicing step, a residue is unlikely to occur when removing the residual protective film by bringing the protective film into contact with the liquid that dissolves the protective film. However, in terms of cost, it is advantageous to use a water-soluble protective film, and remove the protective film by using a liquid (L) that contains water.

In the plasma dicing step, fluorine attaches to the surface of the protective film, and a portion thereof diffuses into the protective film. Only a diffusion layer on the surface side of the protective film where fluorine has diffused may be removed to leave other portions. By leaving the protective film other than the diffusion layer on the substrate, degradation of element chips (for example, element regions) when the element chips are stored for a long period of time can be suppressed.

In the fluorine removing step, the protective film formed in the protective film forming step may be entirely removed. If a portion of the protective film is left, the remaining protective film may produce dust or cause contamination in a subsequent step. By entirely removing the protective film, it is possible to prevent these problems from occurring.

(Plasma Cleaning Step)

The production method according to the present disclosure may include a plasma cleaning step prior to or after the fluorine removing step. The plasma cleaning step is a step of plasma cleaning the element chips that are held on the holding sheet that is supported by the frame to remove the fluorine attached to the side surface of the element chips in the plasma dicing step. The plasma cleaning can be performed by exposing the element chips that are held on the holding sheet that is supported by the frame to a second plasma.

The plasma cleaning may be performed under known conditions for plasma cleaning. In an example of plasma cleaning, a second plasma is generated by using a gas that contains Ar (argon) as a process gas, and the element chips are exposed to the second plasma. The second plasma may contain at least one selected from the group consisting of $O_2$, $CO_2$, and Ar. That is, the plasma cleaning step may be performed by using a plasma that contains at least one selected from the group consisting of $O_2$, $CO_2$, and Ar. It is preferable that the plasma cleaning is performed by using a plasma processing apparatus that is different from the plasma processing apparatus used to perform the plasma dicing step. By doing so, a situation can be suppressed in which fluorine attached to the inside of the reaction chamber of the plasma processing apparatus during the plasma dicing step again attaches to the substrate during plasma cleaning.

The plasma cleaning step may be performed with a spacing between the element chips being widened by stretching the holding sheet after the fluorine removing step. By doing so, the fluorine attached to the side surfaces of the element chips can be easily removed. In this case, as the holding sheet, a stretchable sheet is used.

Element chips are produced in the manner described above. The produced element chips are removed from the holding tape and used.

The processing operations that use plasmas performed in the above-described steps (etching, film forming, cleaning, and ashing) can be performed by using a known plasma processing apparatus. In the case where different plasma processing operations are performed, the plasma processing operations may be performed by using different plasma processing apparatuses or the same plasma processing apparatus.

Hereinafter, an example of the embodiment according to the present disclosure will be described specifically with reference to the drawings. In Embodiments described below, the description given above can be applied. Also, Embodiments described below can be changed based on the description given above. Also, the description described below may be applied to the embodiment described above. Also, in Embodiments described below, matters that are not essential to the method of the present disclosure may be omitted.

Embodiment 1

In Embodiment 1, an example of a production method according to the present disclosure will be described. With this production method, element chips are produced.

Figure 1A:
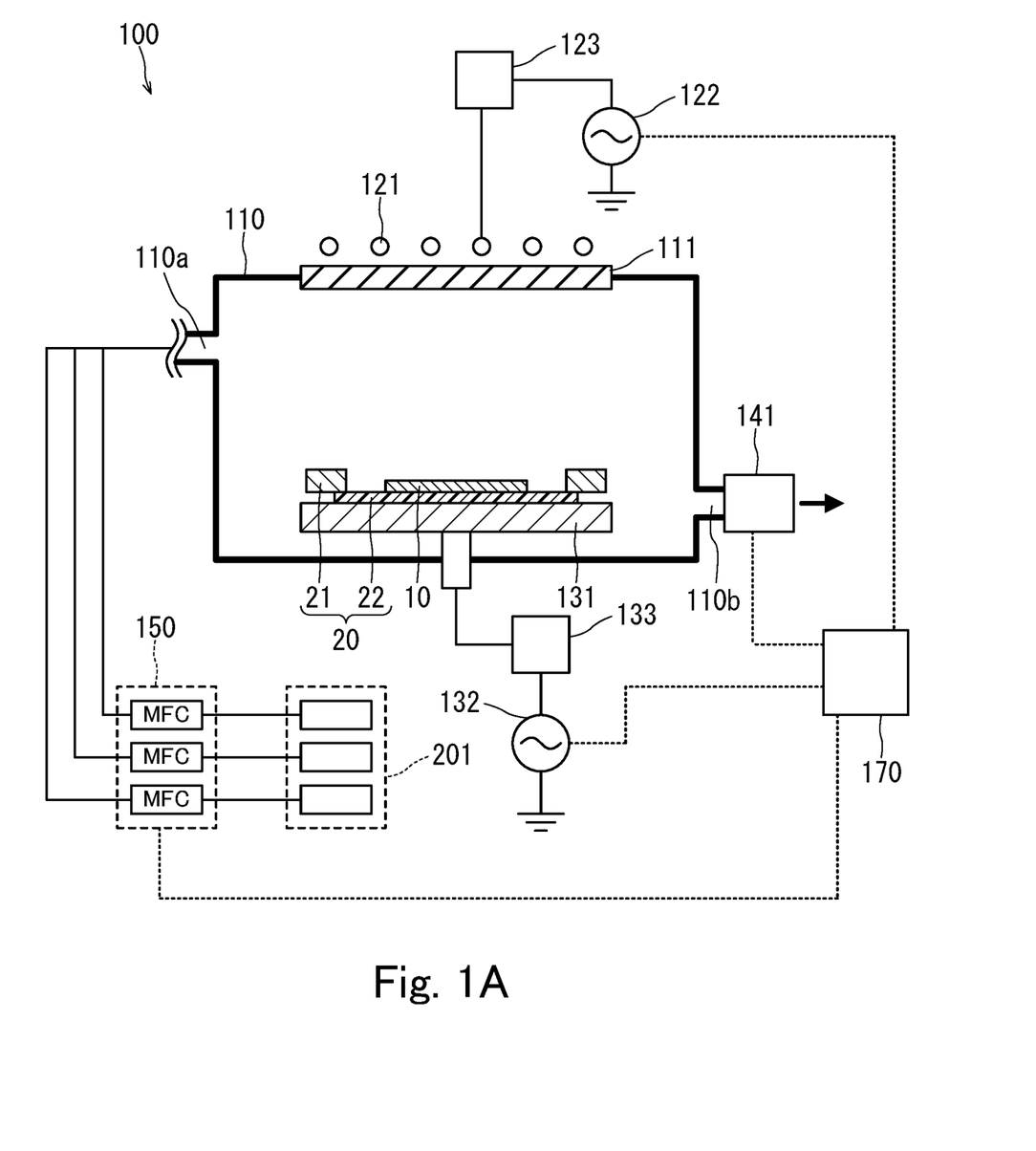
FIG. 1A is a diagram schematically showing an example of an apparatus used in a production method according to Embodiment 1.

A configuration of an example of a plasma processing apparatus used in the production method according to Embodiment 1 is schematically shown in FIG. 1A. An apparatus 100 shown in FIG. 1A includes a chamber 110, a first electrode (antenna) 121, a first high frequency power supply 122, a first matching circuit 123, a substrate stage 131, a second high frequency power supply 132, a second matching circuit 133, a pressure adjustment apparatus 141, a gas flow rate control unit 150, a control apparatus 170, and a manometer (not shown). The control apparatus 170 is connected to units that need to be controlled, and performs control necessary to perform plasma processing. FIG. 1A shows only a few connections between the control apparatus 170 and the units. Known devices can be used as the units included in the apparatus 100, and thus a detailed description thereof will be omitted. Also, the units and the configurations (including the arrangement) thereof can be changed as long as the method of the present disclosure can be performed.

The chamber 110 is a chamber the inside of which can be maintained under a reduced pressure condition. The chamber 110 includes a gas inlet 110a, a gas outlet 110b, and a dielectric window 111. The dielectric window 111 is made of a dielectric (for example, aluminum nitride, alumina, quartz, or the like). The first electrode 121 is disposed adjacent to the dielectric window 111.

A substrate 10 to be subjected to plasma processing in the apparatus 100 and a transport carrier 20 that holds the substrate 10 are disposed on the substrate stage 131. The transport carrier 20 includes a frame 21 and a holding sheet 22. The substrate stage 131 is connected to the second high frequency power supply 132, and also functions as a second electrode. The apparatus 100 includes a fixing mechanism for fixing the transport carrier 20 to the substrate stage 131. Examples of fixing mechanisms include an electrostatic chuck, a vacuum chuck, a clamp, and the like.

The pressure adjustment apparatus 141 is connected to the gas outlet 110b, and reduces the internal pressure of the chamber 110. As the pressure adjustment apparatus 141, a vacuum pump or the like is used. The pressure adjustment apparatus 141 may include a pressure adjustment valve and the like. The apparatus 100 includes a manometer for monitoring the internal pressure of the chamber 110. The control apparatus 170 controls the pressure adjustment apparatus 141 based on the output of the manometer to adjust the internal pressure of the chamber 110.

The gas flow rate control unit 150 is connected to a gas supply source 201 (for example, gas cylinders) of gases supplied to the chamber 110. The control apparatus 170 controls the gas flow rate control unit 150 to adjust the flor rate of each gas. The gas flow rate control unit 150 includes mass flow controllers (MFCs) that are respectively disposed on flow paths through which the gases to be supplied flow. The gases supplied from the gas supply source 201 are introduced into the chamber 110 through the gas flow rate control unit 150 and the gas inlet 110a. FIG. 1A shows an example of an apparatus in which three types of gases are used.

The chamber 110 includes a mechanism (for example, an opening/closing mechanism) (not shown) for transporting the transport carrier 20 holding the substrate 10 into and out of the apparatus 100. In the case where plasma processing is performed by using the apparatus 100, first, the transport carrier 20 (the substrate 10) is disposed on and fixed to the substrate stage 131. Next, the internal pressure of the chamber 110 is reduced by the pressure adjustment apparatus 141, and a predetermined gas is introduced into the chamber 110 from the gas supply source 201. At this time, as described above, the internal pressure of the chamber 110 is adjusted to a desired pressure.

A process gas is introduced into the chamber 110. In the case where plasma etching is performed, an etching gas is introduced. In the case where a protective layer is formed, a gas for forming the protective layer is introduced.

Next, a plasma is generated in the chamber 110 by the first high frequency power supply 122 applying high frequency power to the first electrode 121. The substrate 10 is exposed to and processed by the generated plasma. In the plasma processing, a bias voltage may be applied by the second high frequency power supply 132 as needed.

Figure 1B:
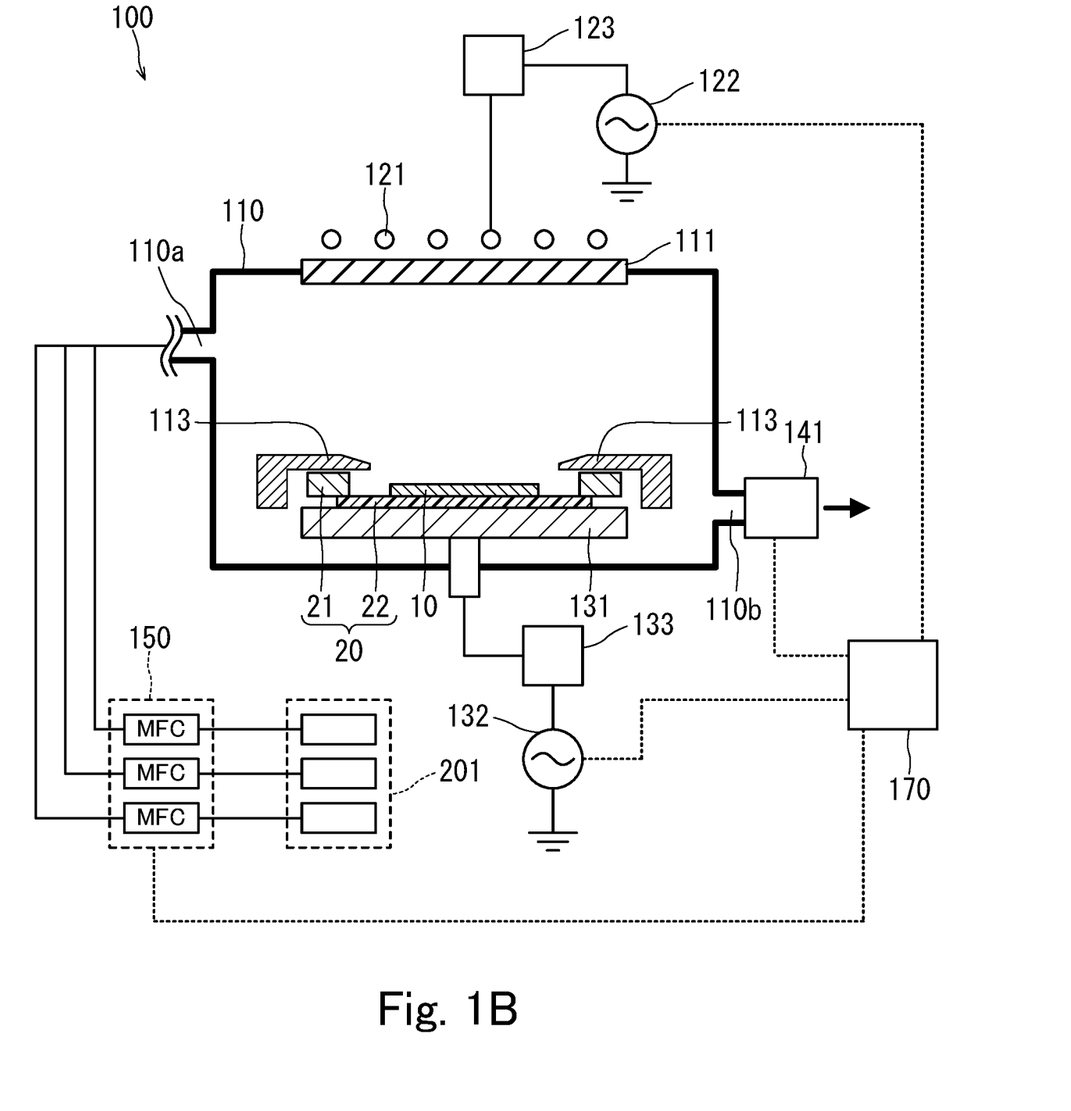
FIG. 1B is a diagram schematically showing another example of an apparatus used in the production method according to Embodiment 1.

The apparatus 100 may include a cover that is disposed to cover a portion of the exposed region of the holding sheet 22 and the frame 21. An example of an apparatus that includes such a cover is shown in FIG. 1B. A cover 113 shown in FIG. 1B is connected to a lifting mechanism (not shown), and is therefore capable of being moved up and down. During plasma processing, the cover 113 is moved down to cover the outer edge of the transport carrier 20. At this time, the cover 113 may or may not come into contact with the frame 21. With the cover 113, a situation can be suppressed in which a portion of the holding sheet 22 and the frame 21 are exposed to a plasma. With this configuration, an advantage can be obtained in that a situation can be suppressed in which the holding sheet 22 is heated by the plasma and is damaged. On the other hand, due to the intrusion of the plasma, the diffusion of fluorine, and the like, even if the cover is provided, it is difficult to completely prevent fluorine from attaching to the protective film on the transport carrier 20.

In the case where the apparatus 100 that includes the cover 113 is used, it is difficult to remove the protective film formed on the transport carrier 20 by using a plasma in the apparatus 100. Even in this case, by using a protective film that is removable with a liquid (L), the protective film can be easily removed. In particular, by using a protective film that is removable with a liquid (L) that contains water, the protective film can be removed inexpensively and easily.

In Embodiment 1, an example is described in which a protective film that is water soluble and can be grooved by laser grooving is used. As described above, a different protective film may be used.

Figure 2A:
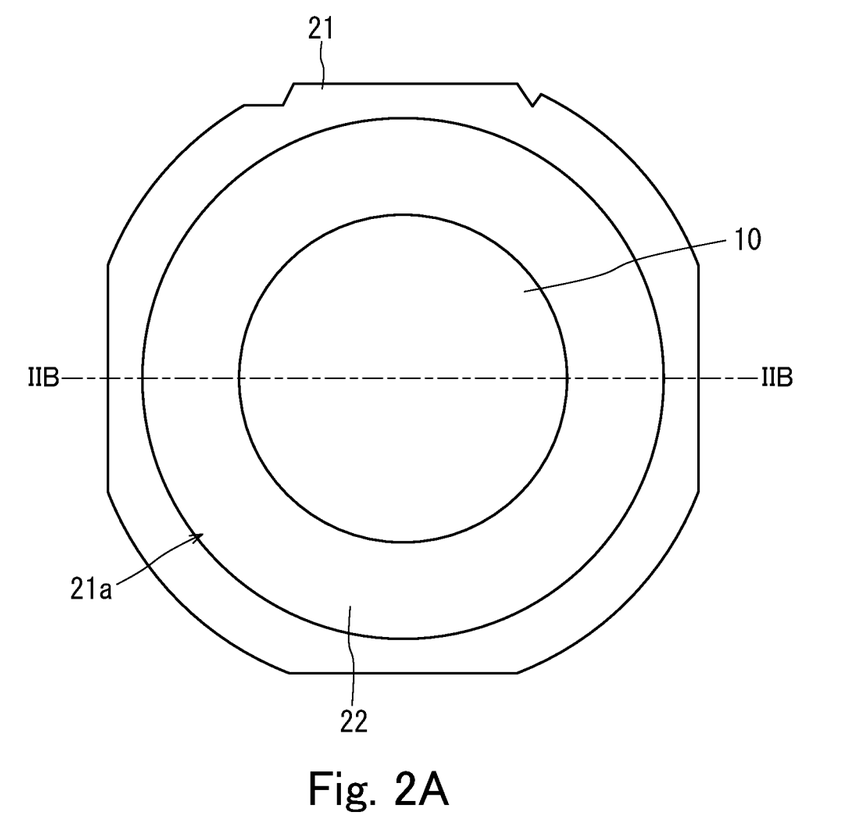
FIG. 2A is a top view showing an example of a step included in the production method according to Embodiment 1.
Figure 2B:
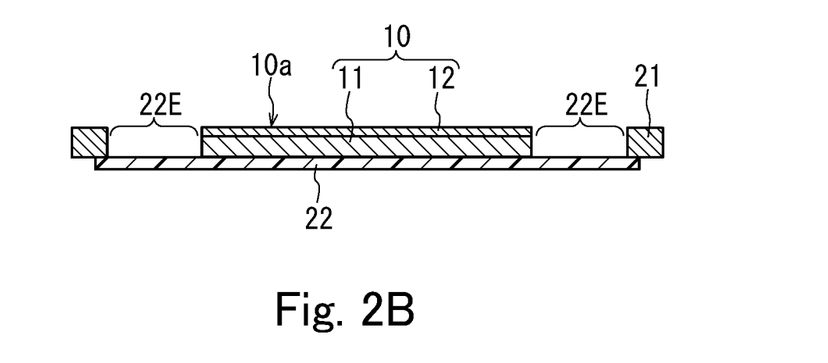
FIG. 2B is a cross-sectional view taken along the line IIB-IIB shown in FIG. 2A.

In the production method according to Embodiment 1, first, a substrate 10 that is held on a transport carrier 20 is prepared. FIG. 2A shows a top view of the substrate 10 held on the transport carrier 20. FIG. 2B shows a cross-sectional view taken along the line IIB-IIB shown in FIG. 2A. The transport carrier 20 includes a frame 21 and a holding sheet 22 that is fixed to the frame 21. The substrate 10 is held on the holding sheet 22.

In Embodiment 1, an example is described in which a circular substrate 10 is used. The frame 21 includes an opening 21a that is larger than the substrate 10. The opening 21a is closed by the holding sheet 22. The frame 21 in the example shown in FIG. 2A is a frame that has notches at portions of the outer edge. As shown in FIG. 2B, a portion of the holding sheet 22 (exposed region 22E) is exposed between the substrate 10 and the frame 21.

In Embodiment 1, an example is described in which the substrate 10 includes a silicon layer (silicon substrate) 11 and an element layer 12. However, a different substrate may be used. The substrate 10 includes a silicon layer 11 and an element layer 12 that is disposed on a major surface 10a side of the substrate 10. Embodiment 1 shows an example in which the substrate 10 is held on the holding sheet 22 such that the element layer 12 is spaced apart from the holding sheet 22. However, the substrate 10 may be held on the holding sheet 22 such that the element layer 12 is disposed on the holding sheet 22 side of the substrate 10.

Figure 4A:
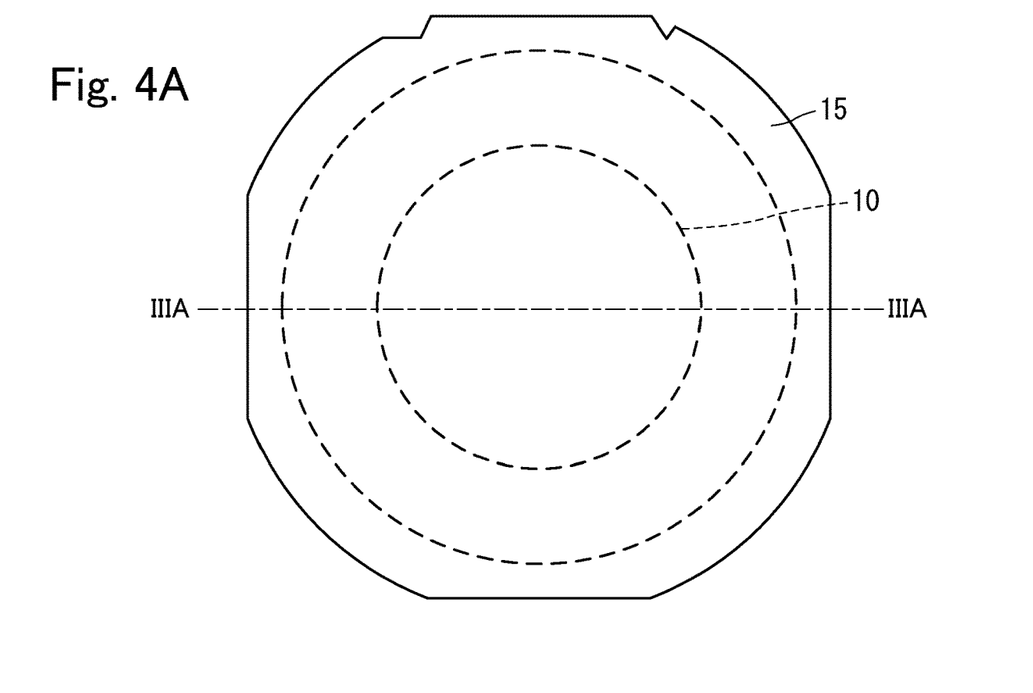
FIG. 4A is a top view of a member shown in FIG. 3A.
Figure 4B:
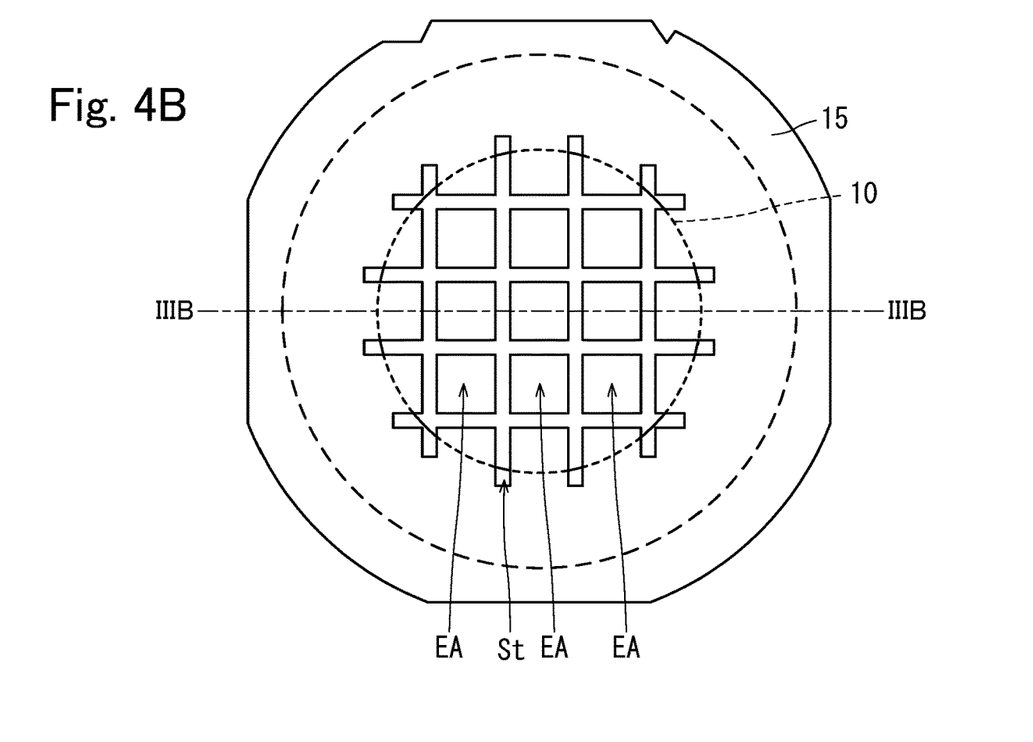
FIG. 4B is a top view of a member shown in FIG. 3B.

The substrate 10 is sectioned into dicing regions St and a plurality of element regions EA that are defined by the dicing regions St (see FIG. 4B and the like). By dividing the substrate 10 by removing portions that correspond to the dicing regions St of the substrate 10, a plurality of element chips, each including the element layer 12, are obtained. The dicing regions St are arranged in the form of, for example, a lattice. The element layer 12 is a layer that is necessary for the element chips to function as elements.

Figure 3A:
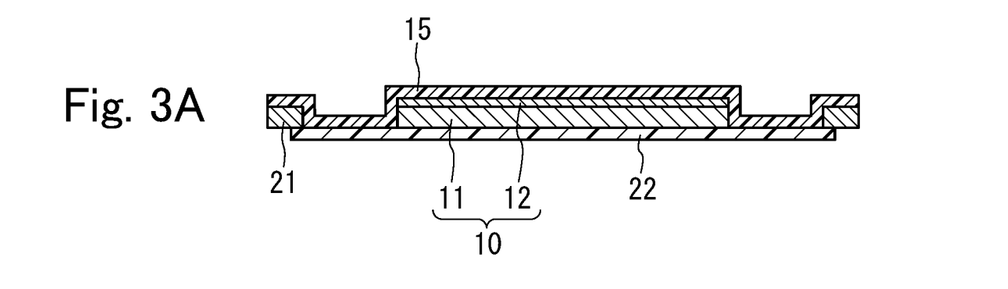
FIG. 3A is a cross-sectional view showing an example of a step performed subsequent to the step shown in FIG. 2A.

Next, as shown in FIG. 3A, a protective film 15 is formed to cover the frame 21, the holding sheet 22, and the substrate 10. A top view of FIG. 3A is shown in FIG. 4A. The cross-sectional view shown in FIG. 3A is a cross-sectional view taken along the line IIIA-IIIA shown in FIG. 4A. The protective film 15 is formed on the side on which the substrate 10 is present. In the example shown in FIG. 3A, the protective film 15 is formed to cover the entire surfaces of the frame 21 and the holding sheet 22 that are exposed on the side on which the substrate 10 is present, and the entire exposed surface of the substrate 10. The protective film 15 is a film that is water soluble and can be grooved by laser grooving. The protective film 15 can be formed by, for example, applying a coating liquid for forming the protective film 15 and drying the coating liquid.

Figure 3B:
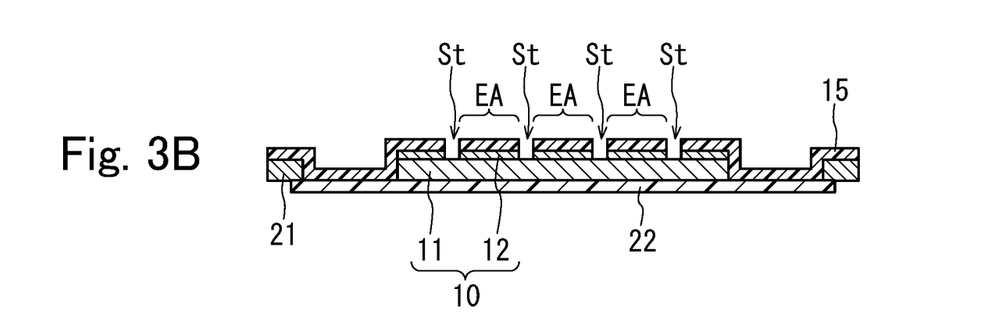
FIG. 3B is a cross-sectional view showing an example of a step performed subsequent to the step shown in FIG. 3A.

Next, as shown in FIG. 3B, the protective film 15 is patterned by removing a part of the protective film 15 that are present in the dicing regions St so as to expose portions of the substrate 10 that are present in the dicing regions St. A top view of FIG. 3B is shown in FIG. 4B. The cross-sectional view shown in FIG. 3B is a cross-sectional view taken along the line IIIB-IIIB shown in FIG. 4B. The portions surrounded by the dicing regions St are element regions EA. FIGS. 3B and 4B show a state in which portions of the element layer 12 that are present in the dicing regions St have also been removed. The protective film 15 is removed by irradiating the part of the protective film 15 that are present in the dicing regions St with a laser (laser grooving). The portions of the element layer 12 that are present in the dicing regions St may be removed by using a method suitable for the element layer 12. For example, the element layer 12 may be removed together with the protective film 15 during laser grooving, or may be removed by performing plasma etching that uses the protective film 15 as a mask.

Figure 3C:
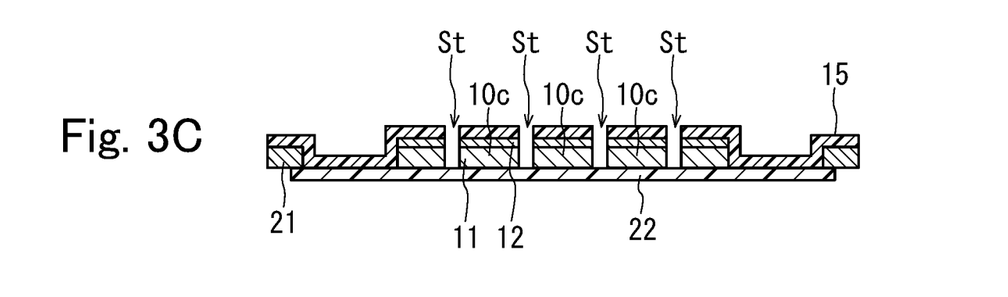
FIG. 3C is a cross-sectional view showing an example of a step performed subsequent to the step shown in FIG. 3B.

Next, as shown in FIG. 3C, a process that includes an etching step of etching the substrate 10 by exposing the substrate 10 to a first plasma that contains fluorine is performed. For example, the Bosch process described above is performed. At this time, the protective film 15 that has been patterned functions as a mask. The substrate 10 is thereby individualized into a plurality of element chips 10c (plasma dicing step).

In an example of the plasma dicing step, a step group including a silicon layer etching step, a protective layer forming step, and a protective layer etching step in this order is repeatedly performed. The silicon layer etching step is performed by plasma etching that uses an etching gas that contains a fluorine-containing gas. In the silicon layer etching step, portions of the silicon layer 11 that are present in the dicing regions St are etched, and recesses are thereby formed.

In the protective layer forming step, a protective layer is formed to cover the surfaces of the recesses that have been formed. The protective layer can be formed by performing plasma processing. As the process gas used in the plasma processing, a gas that contains carbon fluoride can be used. Examples of carbon fluorides include: fluorinated alicyclic hydrocarbons such as octafluorocyclobutane ($C_4F_8$) and octafluorocyclopentene ($C_5F_8$); difluoromethane ($CH_2F_2$); and the like.

In the protective layer etching step, the protective layer that is present on the bottom of each recess is removed by performing anisotropic plasma etching to expose the silicon layer 11 on the bottom of the recess. As the etching gas, a known etching gas used to etch protective layers in the Bosch process can be used. Specifically, the gases listed as examples of etching gases in the description of the silicon layer etching step can be used.

After that, the steps described above are repeated. In the next silicon layer etching step, the silicon layer 11 exposed on the bottom of each recess is etched. In this way, the silicon layer 11 is deeply etched. By repeating the steps described above, the substrate 10 can be divided.

In the case where a die attach film (not shown) is provided between the substrate 10 and the holding sheet, a part of the die attach film that are present in the dicing regions St may be removed as needed. The die attach film can be removed by performing plasma etching or plasma ashing.

Figure 3D:
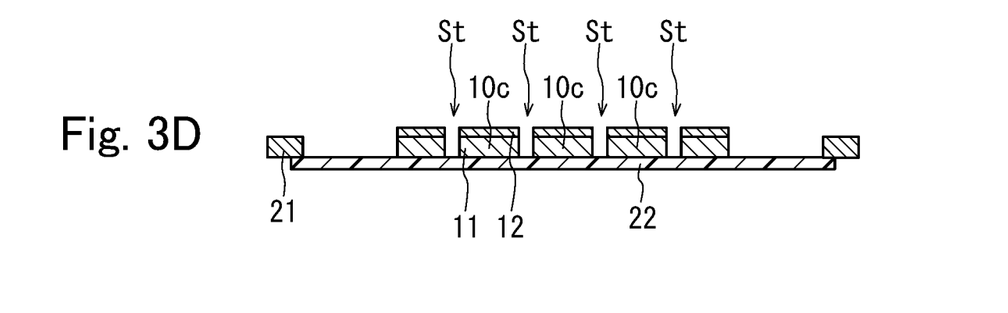
FIG. 3D is a cross-sectional view showing an example of a step performed subsequent to the step shown in FIG. 3C.

Next, as shown in FIG. 3D, the protective film 15 is removed. FIG. 3D shows an example in which the protective film 15 formed in the protective film forming step is entirely removed. By removing the protective film 15, fluorine attached to the protective film 15 is removed.

In the case where the protective film 15 is removed by performing plasma processing (for example, plasma ashing), the protective film 15 may be removed by using the apparatus 100. Alternatively, the substrate 10 and the transport carrier 20 holding the substrate 10 may be transported to a plasma processing apparatus for removing the protective film 15, and the protective film 15 may be removed in the plasma processing apparatus.

In the case where the protective film 15 is removed by dissolving the protective film 15 by using a liquid, the protective film 15 may be removed after the substrate 10 and the transport carrier 20 holding the substrate 10 are transported out of the apparatus 100. For example, the substrate 10 and the transport carrier 20 may be immersed in a liquid (L) that dissolves the protective film 15. Alternatively, the substrate 10 and the transport carrier 20 may be transported to a cleaning apparatus, and the protective film 15 may be removed by using a liquid (L) in the cleaning apparatus. As an example of a cleaning apparatus, the cleaning apparatus includes a mechanism that holds and rotates the transport carrier 20 and a nozzle that ejects the liquid (L). The nozzle may be a two-fluid nozzle.

A plurality of element chips 10c are obtained in the manner described above. The element chips 10c are removed from the holding sheet 22 before the element chip 10c are used.

An experiment was performed in which a silicon substrate was individualized into a plurality of chips by using the method described above. In this experiment, a silicon substrate with a thickness of 200 µm was used. As the protective film, a protective film that is water soluble and can be groove by laser grooving was used. The protective film was patterned by performing the laser grooving. In the fluorine removing step, the protective film was removed by water washing with deionized water. In the fluorine removing step, the protective film was entirely removed. Then, elementary analysis was performed on the surface of each member before plasma dicing by using X-ray photoelectron spectroscopy (XPS). The results of analysis are shown in Table 1. "Before plasma dicing" in Table 1 refers to a period between after the protective film was formed and before plasma dicing was performed. "After plasma dicing" in Table 1 refers to a period between after plasma dicing was performed and before the fluorine removing step was performed.

TABLE 1

| | | Amount of element (atom %) | | |
| --- | --- | --- | --- | --- |
| | Element | Before plasma dicing | After plasma dicing | After fluorine removing step |
| Substrate or chip portion | C | 66.8 | 29.2 | 32.5 |
| | O | 30.2 | 20.3 | 40.2 |
| | F | — | 26.2 | 0.3 |
| | Si | — | 0.9 | 27.1 |
| | Other elements | 3.0 | 23.4 | — |
| Holding tape portion | C | 66.2 | 33.7 | 64.6 |
| | O | 29.9 | 0.9 | 28.6 |
| | F | 1.1 | 65.4 | — |
| | Si | — | — | — |
| | Other elements | 2.8 | — | 3.3 |

The sign "-" in Table 1 indicates that detection was not substantially possible. The analysis values shown in "substrate or chip portion" and "holding tape portion" are, in the case where a protective film was formed on these portions, analysis values obtained as a result of analysis being performed on the surface of the protective film. As can be seen from Table 1, a large amount of fluorine was attached to the protective film during plasma dicing. Also, as can be seen from Table 1, the attached fluorine was removed in the fluorine removing step. Although analysis was not performed on the frame portion, analysis values that would be obtained as a result of analysis being performed on the frame portion are considered to be substantially the same as the analysis values of the holding tape portion.

As described above, the production method according to the present disclosure may include a plasma cleaning step. In this case, the plasma cleaning step may be performed without stretching the holding sheet 22. Alternatively, the plasma cleaning step may be performed with the spacing between element chips 10c being widened by stretching the holding sheet 22. In this case, an apparatus for performing plasma cleaning may include a mechanism for stretching the holding sheet 22. The plasma cleaning may be performed by using the same apparatus as that used for plasma dicing. However, from the viewpoint of reducing contamination caused by fluorine, it is preferable to perform the plasma cleaning by using an apparatus that is different from the apparatus used for plasma dicing.

Figure 5A:
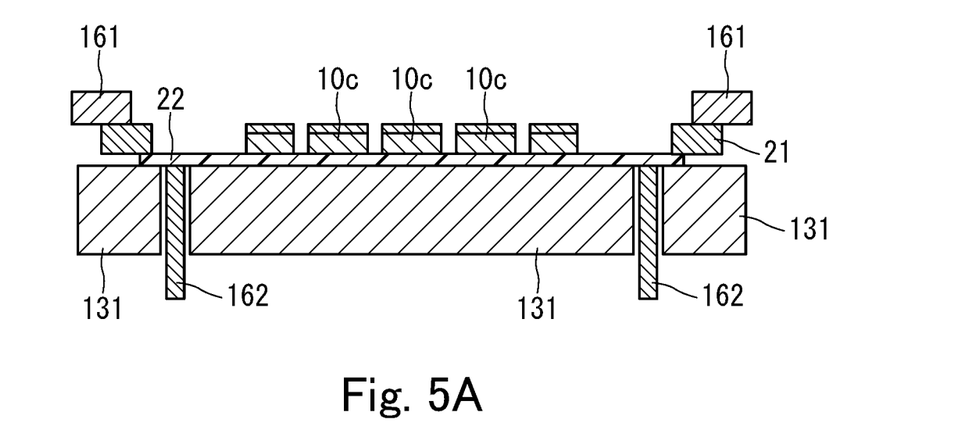
FIG. 5A is a cross-sectional view showing an example of a step included in the production method according to Embodiment 1.

An example of a mechanism for stretching the holding sheet 22 is schematically shown in FIG. 5A. An apparatus used in this case includes a pressing member 161 that presses the outer edge of the frame 21 toward the substrate stage 131 and a cylindrical member 162 for lifting a portion of the holding sheet 22 that is adjacent to the frame 21. The pressing member 161 is connected to a lifting mechanism (not shown), and is therefore capable of being moved up and down. The cylindrical member 162 is also connected to a lifting mechanism (not shown), and is therefore capable of being moved up and down.

Figure 5B:
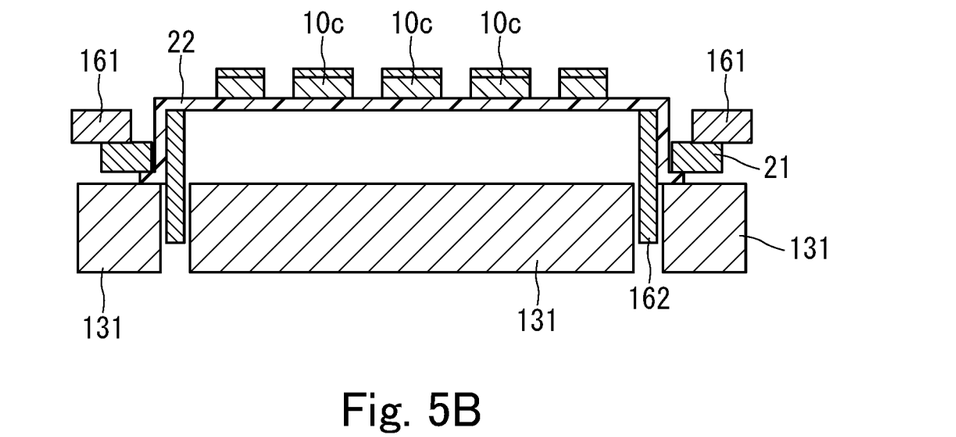
FIG. 5B is a cross-sectional view showing an example of a step performed subsequent to the step shown in FIG. 5A.

In the case where the holding sheet 22 is stretched, as shown in FIG. 5B, the cylindrical member 162 is moved up. As a result, the holding sheet 22 is stretched, and the spacing between element chips 10c is widened. By performing plasma cleaning in this state, the plasma easily intrudes to the side surfaces of the element chips 10c, and thus impurities, such as fluorine, attached to the side surfaces of the element chips 10c are easily removed.

Also, in the case where the plasma cleaning step is performed with the holding sheet 22 being stretched, the plasma cleaning step is preferably performed after the protective film formed on the holding sheet 22 has been entirely removed in the fluorine removing step. By doing so, a situation can be suppressed in which the protective film on the holding sheet 22 is cracked when the holding sheet 22 is stretched, generating particles and contaminating the element chips.

The present disclosure is applicable to a method for producing element chips.

REFERENCE NUMERALS 10 substrate
10c element chip
11 silicon layer
12 element layer
15 protective film
20 transport carrier
21 frame
22 holding sheet
EA element region
St dicing region

What is claimed is:
1. A method for producing element chips, the method comprising:
 a preparing step of preparing a substrate held on a holding sheet supported by a frame, the substrate including element regions and dicing regions;
 a protective film forming step of forming a protective film to cover the frame, the holding sheet, and the substrate by applying a coating liquid;
 a patterning step of removing a part of a substrate covering portion of the protective film to expose the dicing regions of the substrate, the substrate covering portion covering the substrate while the protective film covering the frame, the holding sheet and the element regions of the substrate remains;
 a plasma dicing step including a process that uses a plasma that contains fluorine, the plasma dicing step being a step of individualizing the substrate into a plurality of element chips by etching a portion of the substrate exposed in the patterning step while the frame, the holding sheet and the element regions of the substrate are covered by the protective film; and
 a fluorine removing step of removing, together with the protective film, fluorine attached to the protective film in the plasma dicing step.

2. The method for producing element chips according to claim 1,
wherein, in the fluorine removing step, the protective film is removed by bringing the protective film into contact with a liquid that dissolves the protective film.

3. The method for producing element chips according to claim 2,
wherein the protective film is a film that is water soluble and can be grooved by laser grooving,
in the patterning step, the part of the substrate covering portion of the protective film are removed by performing the laser grooving, and
the liquid contains water.

4. The method for producing element chips according to claim 1,
wherein, in the fluorine removing step, the protective film formed in the protective film forming step is entirely removed.

5. The method for producing element chips according to claim 1, further comprising:
prior to or after the fluorine removing step, a plasma cleaning step of plasma cleaning the element chips that are held on the holding sheet that is supported by the frame to remove the fluorine attached to side surfaces of the element chips in the plasma dicing step.

6. The method for producing element chips according to claim 5,
wherein the plasma cleaning step is performed by using a plasma that contains at least one selected from the group consisting of $O_2$, $CO_2$, and Ar.

7. The method for producing element chips according to claim 5,
wherein the plasma cleaning step is performed with a spacing between the element chips being widened by stretching the holding sheet after the fluorine removing step.

* * * * *